(12) United States Patent
Smith et al.

(10) Patent No.: US 7,277,273 B2
(45) Date of Patent: Oct. 2, 2007

(54) EQUIPMENT CABINET PROVIDING FULL ACCESS TO EQUIPMENT HOUSED THEREIN

(75) Inventors: Kevan Smith, Overland Park, KS (US); Robert Schiffbauer, Olathe, KS (US); Tomasz Taubert, Overland Park, KS (US)

(73) Assignee: Special Product Company, Overland Park, KS (US)

( * ) Notice: Subject to any disclaimer, the term of this patent is extended or adjusted under 35 U.S.C. 154(b) by 0 days.

(21) Appl. No.: 11/561,576

(22) Filed: Nov. 20, 2006

(65) Prior Publication Data

US 2007/0091550 A1 Apr. 26, 2007

Related U.S. Application Data

(62) Division of application No. 10/948,430, filed on Sep. 23, 2004.

(51) Int. Cl.
*H05K 5/00* (2006.01)
*H05K 7/20* (2006.01)

(52) U.S. Cl. ............... 361/679; 211/26; 312/223.2; 361/690; 361/694; 361/695

(58) Field of Classification Search ............... 361/679, 361/725–727
See application file for complete search history.

(56) References Cited

U.S. PATENT DOCUMENTS

| | | | | |
|---|---|---|---|---|
| 2,994,807 A | * | 8/1961 | Devine et al. ............... 361/727 |
| 3,728,662 A | * | 4/1973 | Puri ............................. 439/64 |
| 4,247,882 A | * | 1/1981 | Prager et al. ............... 361/686 |
| 4,258,967 A | * | 3/1981 | Boudreau ................... 312/322 |
| 4,480,880 A | * | 11/1984 | Cather ......................... 384/26 |
| 4,627,672 A | * | 12/1986 | DeBruyn ..................... 312/331 |
| 4,682,319 A | * | 7/1987 | Einhaus ....................... 720/655 |
| 5,169,221 A | * | 12/1992 | Wheeler ...................... 312/323 |
| 5,226,714 A | * | 7/1993 | Wright ......................... 312/323 |
| 5,299,098 A | * | 3/1994 | Schussler et al. ........... 361/829 |
| 5,433,517 A | * | 7/1995 | Fleisch ..................... 312/334.8 |
| 5,551,775 A | * | 9/1996 | Parvin ..................... 312/334.11 |
| 6,213,434 B1 | * | 4/2001 | Reichanadter, Jr. ...... 248/125.8 |
| 6,247,772 B1 | * | 6/2001 | Tuttle et al. ............. 312/317.3 |

(Continued)

FOREIGN PATENT DOCUMENTS

| EP | 0580075 | * | 7/1996 |
|---|---|---|---|
| EP | 0770758 | * | 5/2001 |

*Primary Examiner*—Gregory D Thompson
(74) *Attorney, Agent, or Firm*—Hovey Williams, LLP

(57) ABSTRACT

A cabinet (10) that provides full access to equipment (12) mounted therein broadly comprises a housing (13) for housing the equipment (12), an access door (24) for selectively protecting the equipment (12), a rack (40) for supporting the equipment (12), and a frame (60) for rotatably and slidably supporting the rack (40). The rack (40) preferably includes two vertical members (42,44) spaced apart such that the equipment (12) mounts between the vertical members (42,44), and top and bottom crossbars (46,48) rigidly separating the vertical members (42,44). The frame (60) preferably includes a substantially vertical support (66) presenting a substantially horizontal flange (70), and a substantially horizontal shelf (68) extending from the vertical support (66) below the rack (40). The rack (40) is rotatably secured to the frame (60) through vertical axles (72,74) and rigidly fixed by a locking mechanism (80) for selectively preventing rotation of the rack (40).

12 Claims, 7 Drawing Sheets

U.S. PATENT DOCUMENTS

| | | | |
|---|---|---|---|
| 6,585,336 B2* | 7/2003 | Munday et al. | 312/334.4 |
| 6,641,238 B2* | 11/2003 | Branz et al. | 312/292 |
| 6,658,700 B2* | 12/2003 | Wortman et al. | 16/382 |
| 6,688,710 B2* | 2/2004 | Tagawa | 312/223.2 |
| 2003/0007767 A1* | 1/2003 | Douglas et al. | 385/135 |
| 2003/0165315 A1* | 9/2003 | Trebesch et al. | 385/135 |
| 2005/0225936 A1* | 10/2005 | Day | 361/687 |

* cited by examiner

EQUIPMENT CABINET PROVIDING FULL ACCESS TO EQUIPMENT HOUSED THEREIN

RELATED APPLICATIONS

The present application is a divisional patent application and claims priority benefit, with regard to all common subject matter, of earlier-filed U.S. nonprovisional patent applications titled "EQUIPMENT CABINET PROVIDING FULL ACCESS TO EQUIPMENT HOUSED THEREIN", Ser. No. 10/948,430, filed Sep. 23, 2004. The identified earlier-filed application is hereby incorporated by reference into the present application.

BACKGROUND OF THE INVENTION

1. Field of the Invention

The present invention relates to electrical equipment cabinets. More particularly, the present invention relates to a cabinet that allows full access to equipment mounted therein.

2. Description of Prior Art

Many electrical equipment cabinets exist to protect electrical equipment. While most designs adequately protect equipment mounted therein, they do not allow sufficient access to the equipment, without removing the equipment.

Some cabinets include doors and/or removable panels that allow access to equipment's front, sides, and rear. However, such panels require significant space all around the cabinet. For example, sufficient space must be provided for a technician to remove a panel and then work on the equipment behind the panel. Such space requirements are often impracticable, or even impossible, to achieve behind and along side cabinets.

Yet other cabinets include racks that swing out of the cabinet, but the allowable equipment depth in such cabinets is limited due to the width of the cabinet. If the equipment is too deep, for example, the equipment will contact the side of the cabinet when rotated out.

Accordingly, there is a need for an improved electrical equipment cabinet that overcomes the limitations of the prior art.

SUMMARY OF THE INVENTION

The present invention overcomes the above-identified problems and provides a distinct advance in the art of electrical equipment cabinets. More particularly, the present invention provides a cabinet that allows full access to equipment mounted therein, without requiring the use of removable doors and/or panels.

The cabinet of the present invention allows the equipment mounted therein to slide out and rotate, thereby allowing access to a rear of the equipment. The cabinet of the present invention also eliminates various problems associated with cabinets that only allow equipment to swing out, including equipment contacting the side of the cabinet. The cabinet broadly comprises a housing, a rack for supporting the equipment within the housing, and a frame to rotatably support the rack. The housing preferably comprises first and second opposed side walls, a rear wall extending between rear edges of the side walls, a top wall connecting top edges of the side walls and the rear wall, a bottom wall connecting bottom edges of the side walls and the rear wall and spaced below the top wall. The housing also preferably comprises an access door positioned opposite the rear wall. Thus, the door selectively provides protection for or access to the equipment.

The rack preferably comprises a first vertical member adjacent the first sidewall, a second vertical member adjacent the second sidewall, and top and bottom crossbars rigidly separating the vertical members such that the equipment mounts between the vertical members. The vertical members each preferably present a mounting surface to which brackets of the equipment may be secured. In this regard, the mounting surface preferably includes mounting holes through which screws may be threaded to secure the equipment to the rack.

The frame preferably comprises a sliding member supporting the rack and slidably secured within the cabinet. The sliding member preferably includes a substantially vertical support and a substantially horizontal shelf. The vertical support may extend upwardly from the shelf adjacent either the first or second side wall of the cabinet. The vertical support preferably includes a flange that protrudes substantially horizontally from a top of the vertical support and substantially parallel to the shelf. The rack preferably rotates freely between the shelf and the flange about a top vertical axle which extends below the flange and a bottom vertical axle which extends above the shelf. Both axles are preferably positioned adjacent the vertical support and vertically aligned to allow free rotation of the rack. Thus, the axles define the rack's axis of rotation, which is preferably adjacent the vertical support, thereby allowing the vertical support to control the rack's axis of rotation, as the rack is rotated.

As the vertical support may be positioned adjacent either the first or second sidewall, the rack may rotate either toward or away from the door. Having the vertical support adjacent the door, thereby requiring the rack to rotate toward the door, allows full access to the rear of the equipment mounted in the rack with only an approximately ninety degree rotation of the rack. Alternatively, having the vertical support positioned opposite the door, thereby requiring the rack to rotate away from the door, allows full access to the equipment mounted in the rack with an approximately one hundred and eighty degree rotation of the rack.

The shelf preferably presents a locking mechanism to selectively prevent rotation of the rack. Thus, the locking mechanism is preferably positioned at a distance from the vertical support. In this manner, the locking mechanism is required to provide minimal anti-rotation force, since the force is multiplied by the distance in determining the locking mechanism's resistance to rotational torque. However, the locking mechanism may be located nearer the rack's axis of rotation, provided that the locking mechanism is sufficiently sturdy.

In the preferred embodiment, the locking mechanism comprises a flange protruding upwardly from the shelf and behind the rack. In this manner, the locking mechanism prevents the rack from rotating too far back into the cabinet, thereby preventing damage to delicate cabling that may be secured to the rear of the equipment. A bolt may be inserted through the rack and secured to the flange, such that the bolt holds the rack against the flange, thereby selectively preventing the rack from rotating forwardly and outwardly.

The sliding member is preferably supported by a first slide mechanism secured adjacent a top of the vertical support and a second slide mechanism secured adjacent a bottom of the vertical support. There may also be one or more additional slide mechanisms supporting the shelf of the frame. The slide mechanisms are preferably substantially conventional roller bearing slide mechanisms and are preferably controlled by a release mechanism that selectively prevents the rack from sliding in or out of the cabinet.

Thus, it can be seen that the cabinet of the present invention provides full access to the equipment mounted therein, without requiring removal of the equipment or the walls. Furthermore, as the equipment is preferably slid substantially completely out of the cabinet before being rotated, deeper equipment may be used.

BRIEF DESCRIPTION OF THE DRAWINGS

A preferred embodiment of the present invention is described in detail below with reference to the attached drawing figures, wherein.

DETAILED DESCRIPTION OF A PREFERRED EMBODIMENT

Figure 1:
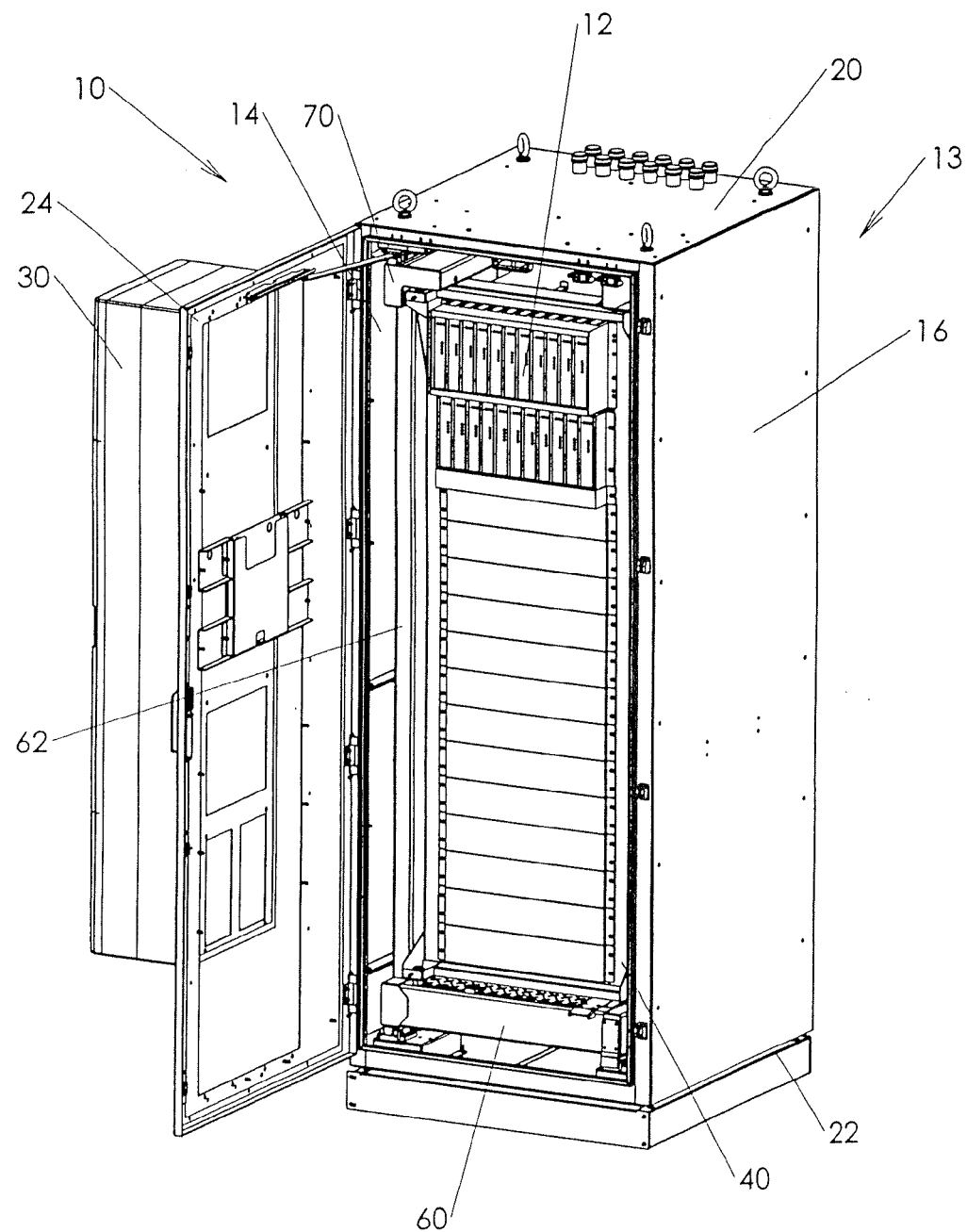
FIG. 1 is a perspective view of a cabinet constructed in accordance with a preferred first embodiment of the present invention and shown with equipment mounted therein.
Figure 2:
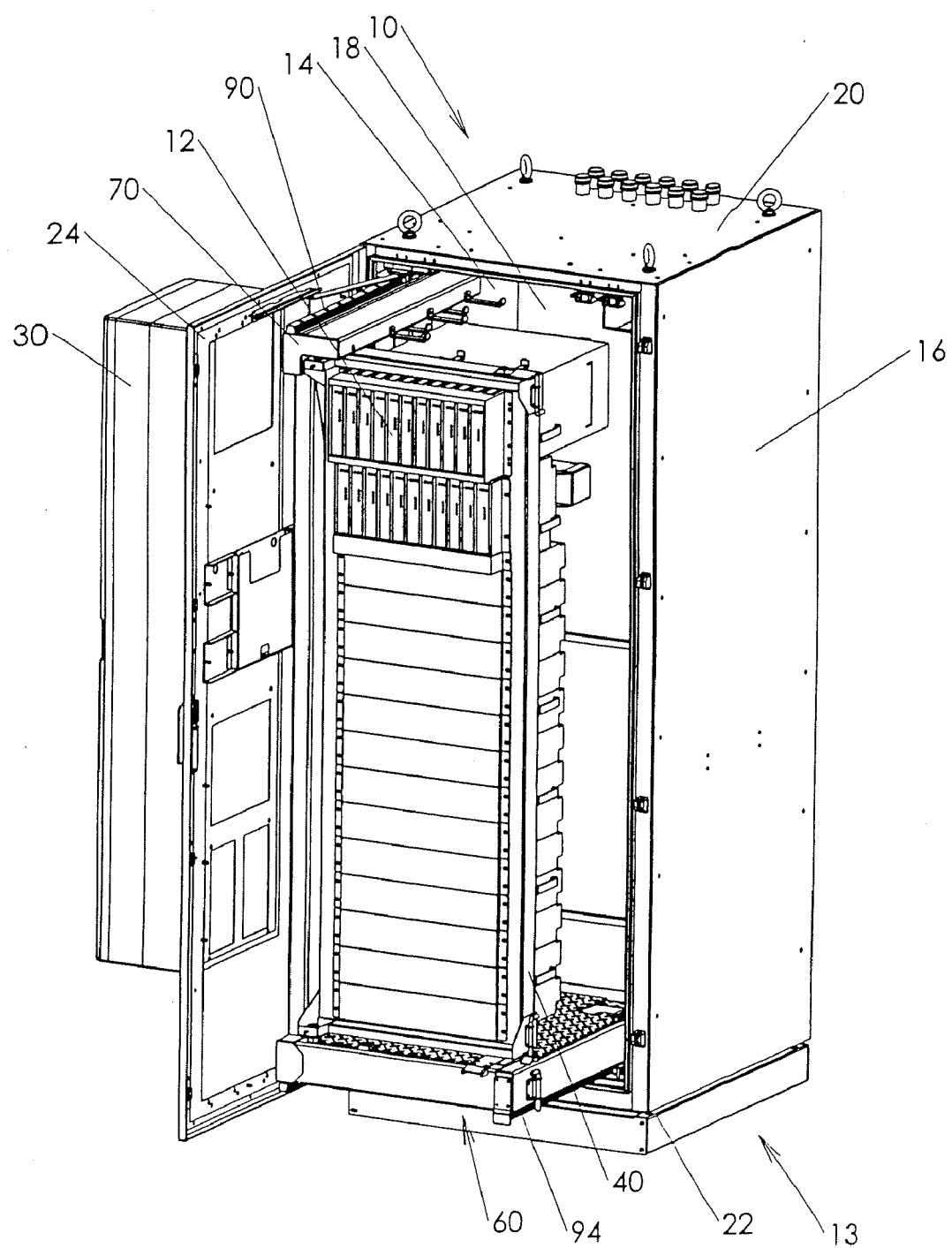
FIG. 2 is a perspective view of the cabinet of FIG. 1 showing the equipment slid out of the cabinet, thereby allowing access to sides of the equipment.
Figure 3:
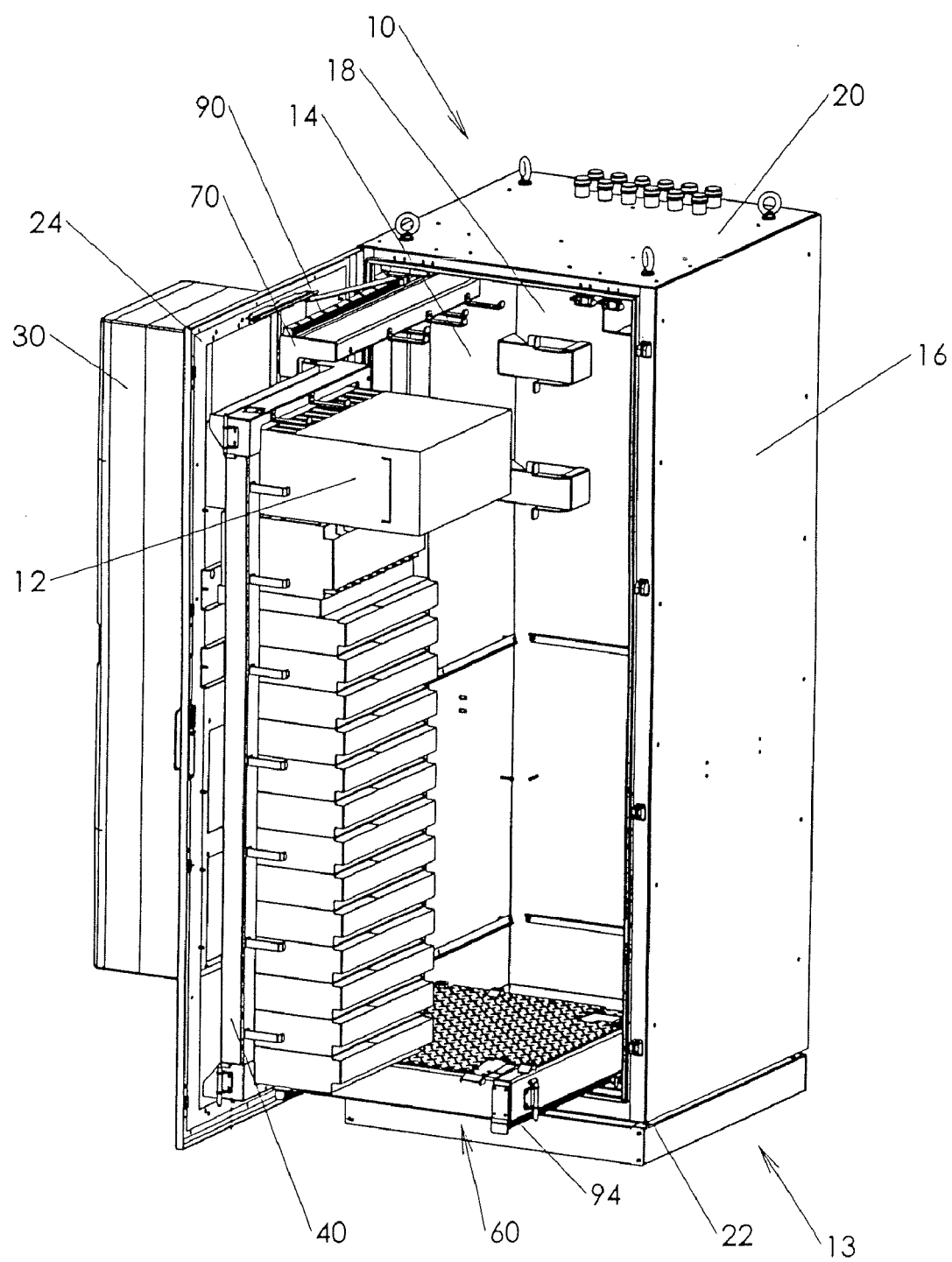
FIG. 3 is a perspective view of the cabinet of FIG. 1 showing the equipment slid out of the cabinet and rotated, thereby allowing access to a rear of the equipment.

Referring to FIG. 1, the preferred cabinet 10 constructed in accordance with a preferred embodiment of the present invention is illustrated enclosing equipment 12. Referring also to FIGS. 2-3, the cabinet 10 allows the equipment 12 to slide out and rotate, thereby allowing access to a rear of the equipment 12. The equipment 12 is preferably communications equipment, such as telephone switchgear, routing equipment, etc.; however, the equipment 12 may be other types of electrical equipment, such as servers, network routers, network switches, or other computing or communications equipment. In any case, the equipment 12 is preferably designed and configured to be rack mounted in standard nineteen inch or twenty-three inch racks; although, the cabinet 10 of the present invention may be modified to accommodate other mounting sizes.

The cabinet 10 broadly comprises a housing 13 having first and second opposed side walls 14,16, a rear wall 18 extending between rear edges of the side walls 14,16, a top wall 20 connecting top edges of the side walls 14,16 and the rear wall 18, a bottom wall 22 connecting bottom edges of the side walls 14,16 and the rear wall 18 and spaced below the top wall 20.

The housing 13 also preferably comprises an access door 24 positioned opposite the rear wall 18 with a vertical axis of rotation adjacent the first side wall 14. Thus, the door 24 selectively provides protection for or access to the equipment 12. The door 24 may include seals, such that the housing 13 is effectively sealed when the door 24 is closed, thereby protecting the equipment 12 from water, dust, and or other contaminants.

The housing 13 may be constructed so that any of the walls 14-22 and/or the door 24, or portions thereof, may be removed. For example, the housing 13 may include an interior skeleton to which the walls 14-22 are secured. However, the housing 13 is preferably constructed so that any such removal requires tools and/or access to the housing's 13 interior. In this manner, the housing 13 may effectively protect the equipment 12 from tampering.

The cabinet 10 may also include a temperature control unit (TCU) 30 to control the equipment's 12 temperature. The TCU 30 is preferably substantially mounted to an exterior of the housing 13 such that the TCU 30 may be substantially fully accessed without substantially exposing the equipment 12. For example, the TCU 30 may be mounted to an exterior surface of any of the walls 14-22 or even the door 24.

Figure 4:
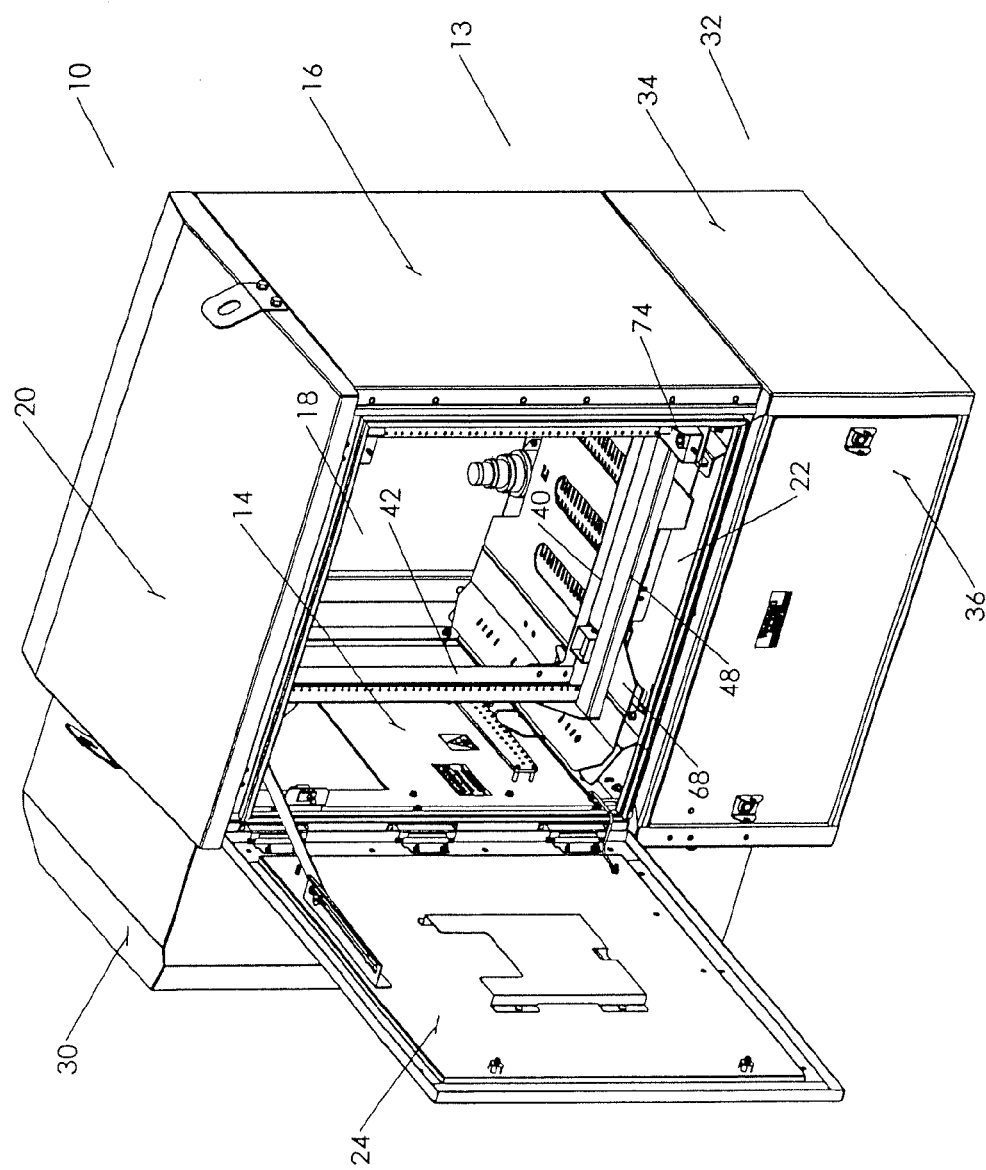
FIG. 4 is a perspective view of a cabinet constructed in accordance with a preferred second embodiment of the present invention with a rack designed to receive equipment shown as empty to better view the cabinet's components.
Figure 5:
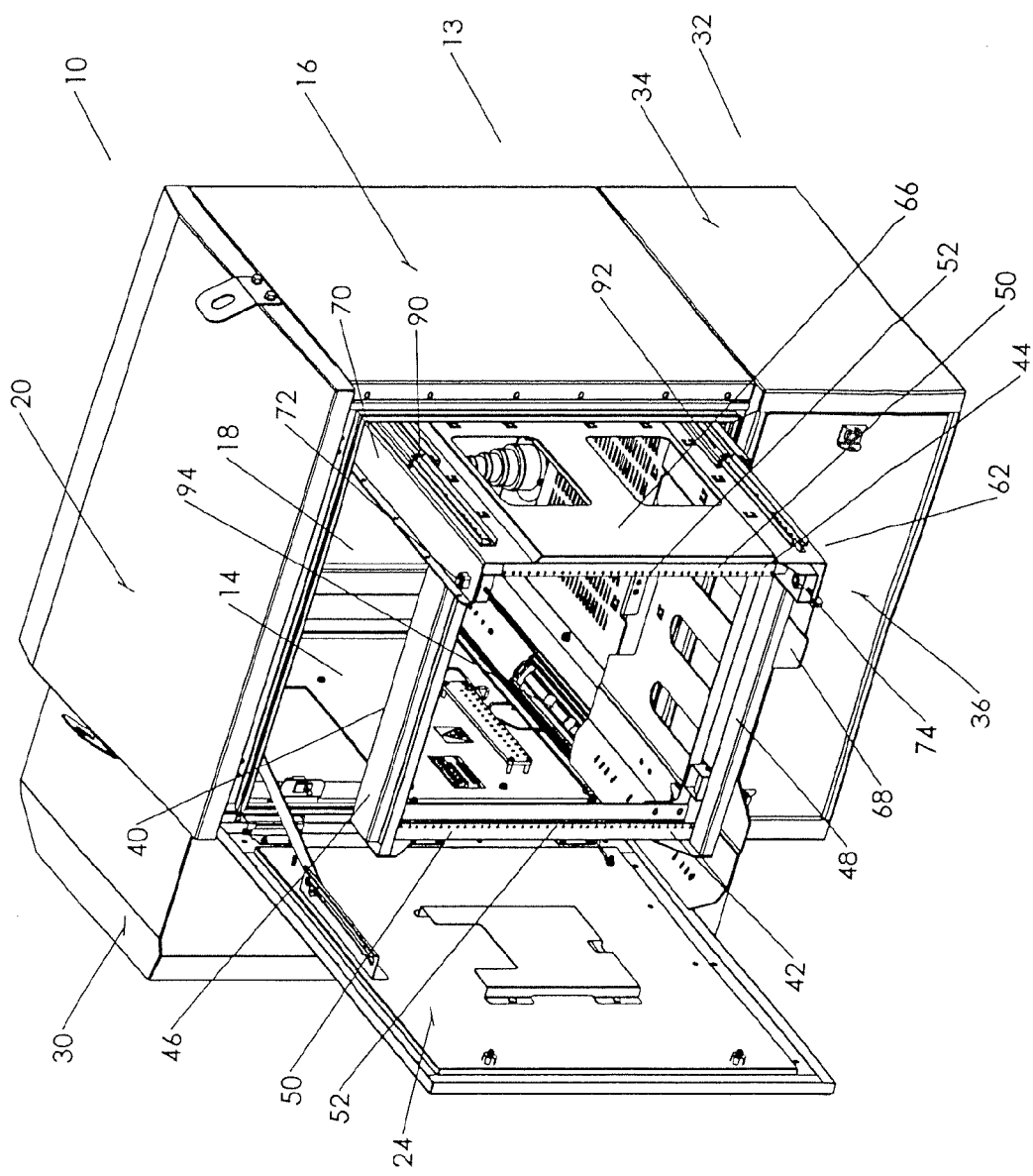
FIG. 5 is a perspective view of the cabinet of FIG. 4 showing the rack slid out of the cabinet, thereby allowing access to sides of any equipment mounted in the rack.
Figure 6:
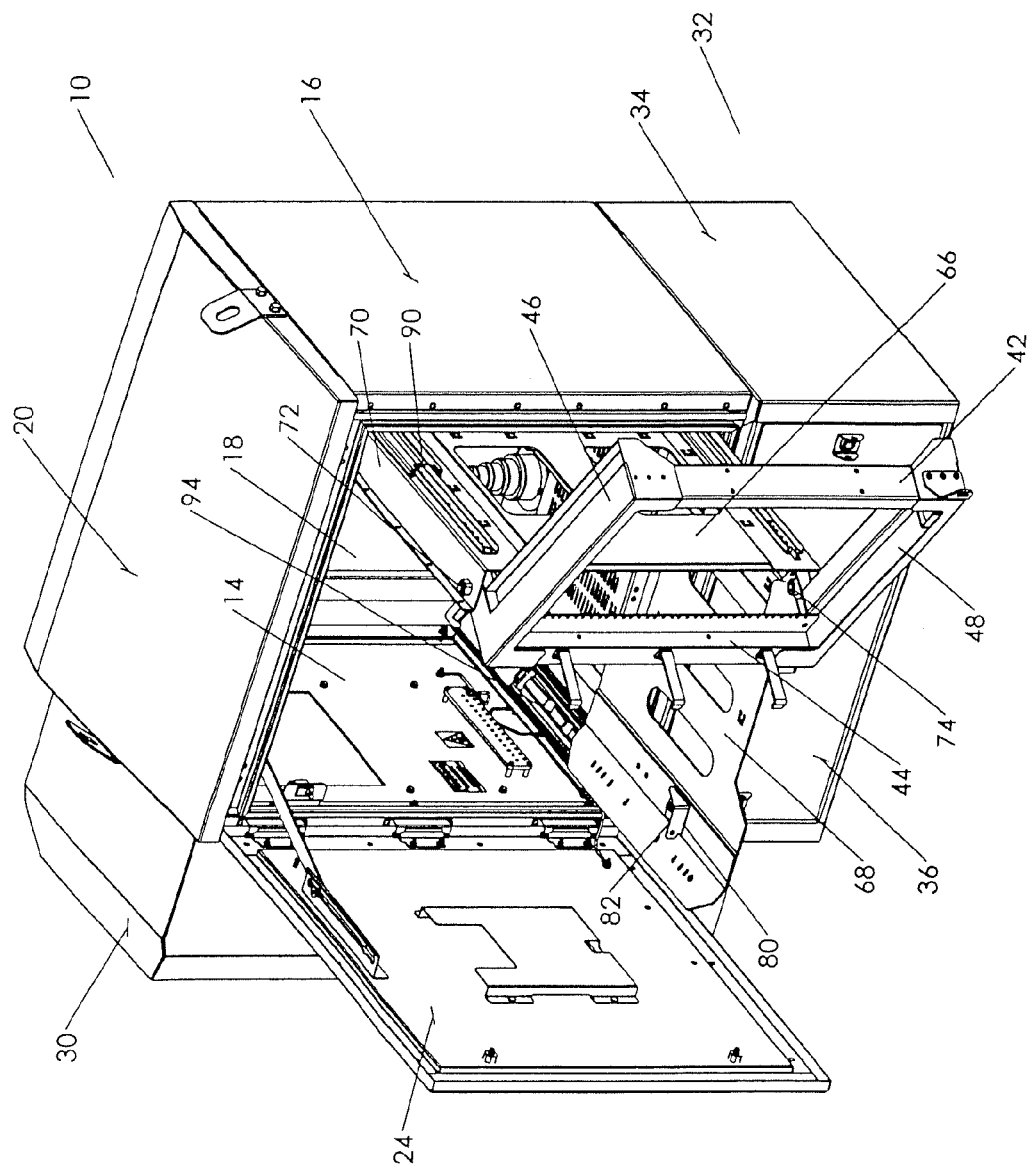
FIG. 6 is a perspective view of the cabinet of FIG. 4 showing the rack slid out of the cabinet and rotated, thereby allowing access to a rear of any equipment mounted in the rack.

Referring also to FIGS. 4-6, the cabinet 10 may also include a power supply unit (PSU) 32 to condition and temporarily provide electrical power to the equipment 12. The PSU is preferably a conventional uninterruptible power supply, but may be virtually any power supply capable of providing power to the equipment 12. The PSU 32 is also preferably mounted to the housing 13 such that the PSU 32 may be substantially fully accessed without substantially exposing the equipment 12. However, the PSU 32 need not be mounted outside the housing 13. For example, the PSU 32 may be mounted in a separate compartment 34 above, below, or to the side of the equipment 12. In one embodiment, the PSU 32 is mounted below the equipment 12, is accessible through a separate hatch 36, and slides out of the housing 13, such that the PSU is fully accessible without exposing the equipment 12. In this configuration, the PSU's 32 weight may be used to steady the cabinet 10. However, any heat from the PSU 32 may propagate upward toward the equipment 12. Therefore, especially for use with heat sensitive equipment, the separate compartment 34 and the separate hatch 36 of the PSU 32 may be mounted above the equipment 12. In any case, the PSU 32 may be mounted much like the equipment 12, such that the PSU 32 may slide out and rotate to provide full access to a rear of the PSU 32.

The cabinet 10 may further include sensors to monitor the housing's 13 integrity. For example, the door 24 may be monitored by a switch, thereby monitoring access to the equipment 12. The cabinet 10 may also include a temperature sensor, either separate from or integral to the TCU 30, to monitor the equipment's 12 temperature. Other sensors, such as humidity, light, and/or sound sensors, may be used to monitor other factors of the equipment's 12 environment.

The equipment 12 is supported within the housing 13 by a rack 40. The rack 40 preferably comprises a first vertical member 42 adjacent the first sidewall 14, a second vertical member 44 adjacent the second sidewall 16, and top and bottom crossbars 46,48 rigidly separating the vertical members 42,44 such that the equipment 12 mounts between the vertical members 42,44. The vertical members 42,44 may be formed as either an angle or a channel. But, in either case, the vertical members 42,44 each preferably present a mounting surface 50 to which brackets of the equipment 12 may be secured. In this regard, the mounting surface 50 preferably includes mounting holes 52 through which screws may be threaded to secure the equipment 12 to the rack 40. While the holes 52 are preferably circular and threaded, the holes 52 may squared, such that cage nuts are required. Since the equipment 12 is preferably standard nineteen inch rack mounted equipment, as discussed above, the vertical members 42,44 are preferably spaced so that a center of the mounting holes 52 of the vertical member 42 are eighteen and five-sixteenths inches from a center of mounting the holes 52 of the vertical member 44.

The cabinet 10 also includes a frame 60 to rotatably support the rack 40. The frame 60 preferably comprises a sliding member 62 supporting the rack 40 and slidably secured within the housing 13. The frame 60 may also include a fixed member rigidly secured within the housing 13 for supporting the sliding member 62. Alternatively, the walls 14-22 or the skeleton of the housing 13 may be used for support.

The sliding member 62 preferably includes a substantially vertical support 66 and a substantially horizontal shelf 68. The vertical support 66 may extend upwardly from the shelf 68 adjacent either the first or second side wall 14,16 of the housing 13. The vertical support 66 preferably includes a flange 70 that protrudes substantially horizontally from a top of the vertical support 66 and substantially parallel to the shelf 68. The rack 40 preferably rotates freely between the shelf 68 and the flange 70. More specifically, the rack 40 is preferably rotatably secured to the frame 60 about a top vertical axle 72 which extends below the flange 70 and through a portion of the rack 40 and a bottom vertical axle 74 which extends above the shelf 68 and through a portion of the rack 40. Both axles 72,74 are preferably positioned adjacent the vertical support 66 and vertically aligned to allow free rotation of the rack 40. Alternatively, the rack 40 may rotate about one axle which extends from the flange 70 to the shelf 68. In any case, the axles 72,74 define the rack's 40 axis of rotation, which is preferably adjacent the vertical support 66, thereby allowing the vertical support 66 to control the rack's 40 axis of rotation, as the rack 40 is rotated.

As the vertical support 66 may be positioned adjacent either the first or second sidewall 14,16, the rack 40 may rotate either toward or away from the door 24. Having the vertical support 66 adjacent the door 24, thereby requiring the rack 40 to rotate toward the door 24, allows full access to the rear of the equipment 12 mounted in the rack 40 with only an approximately ninety degree rotation of the rack 40. However, such configuration may require more usable space in front of the cabinet 10, as this would require a technician to stand to the side of the rack 40. Alternatively, having the vertical support 66 positioned opposite the door 24, thereby requiring the rack 40 to rotate away from the door 24, allows full access to the equipment 12 mounted in the rack 40 with an approximately one hundred and eighty degree rotation of the rack 40. However, such configuration may not require as much space in front of the cabinet 10. In either case, flexibility, slack, and configuration of cabling in front, along side, and/or behind the equipment 12 must be considered.

The shelf 68 may present a surface upon which equipment 12 and/or documents may be stored. However, care should be exercised so as to not interfere with rotation of the rack 40. The shelf 68 also preferably presents a locking mechanism 80 to selectively prevent rotation of the rack 40. Thus, the locking mechanism 80 is preferably positioned at a distance from the vertical support 66. In this manner, the locking mechanism 80 is required to provide minimal anti-rotation force, since the force is multiplied by the distance in determining the locking mechanism's 80 resistance to rotational torque. However, the locking mechanism 80 may be located nearer the rack's 40 axis of rotation, provided that the locking mechanism 80 is sufficiently sturdy.

In the preferred embodiment, the locking mechanism 80 comprises a flange 82 protruding upwardly from the shelf 68 and behind the rack 40. In this manner, the locking mechanism 80 prevents the rack 40 from rotating too far back into the housing 13, thereby preventing damage to delicate cabling that may be secured to the rear of the equipment 12. A bolt may be inserted through the rack 40 and secured to the flange 82, such that the bolt holds the rack 40 against the flange 82, thereby selectively preventing the rack 40 from rotating forwardly and outwardly. Alternatively, the locking mechanism 80 may comprise a latch or other mechanism that may be operated without the use of tools.

The sliding member 62 is preferably supported by a first slide mechanism 90 secured adjacent a top of the vertical support 66 and a second slide mechanism 92 secured adjacent a bottom of the vertical support 66. There may also be one or more additional slide mechanisms 94 supporting the shelf 68 of the frame 60. The slide mechanisms 90-94 are preferably substantially conventional roller bearing slide mechanisms. However, other slide mechanisms, such as tongue and groove friction slide mechanisms, may be used. In any case, the slide mechanisms 90-94 are preferably controlled by a release mechanism that selectively prevents the rack 40 from sliding in or out of the housing 13.

Figure 7:
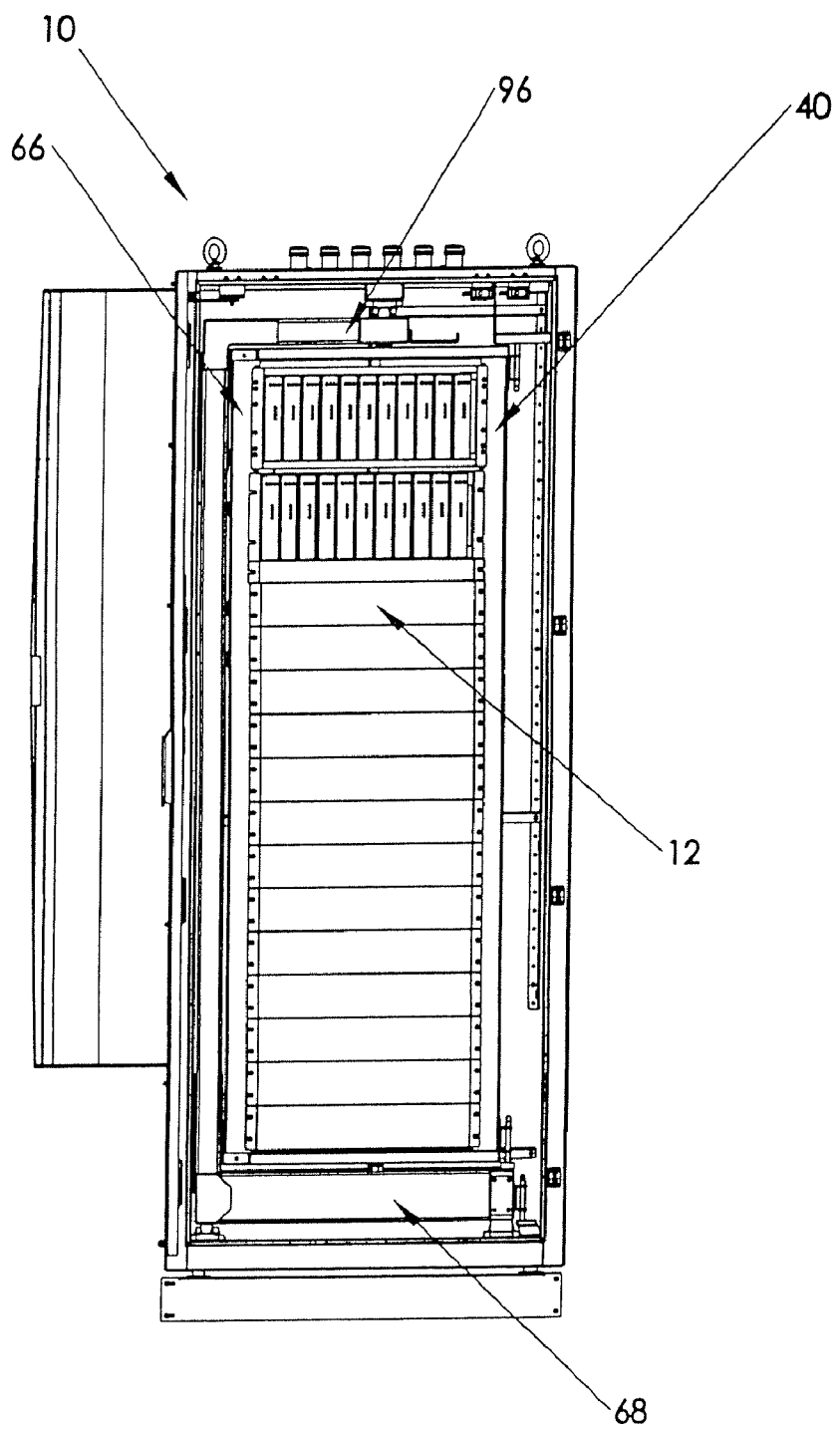
FIG. 7 is a elevation view of a preferred third embodiment of the present invention with a rack operable to rotate about its center.

While the present invention has been described above, it is understood that other materials and/or dimensions can be substituted. For example, while only one door 24 has been described herein, two doors may be used. More specifically, the doors may meet along a center line of the cabinet 10, with one door opening to the right and the other door opening to the left. Alternatively, or additionally, the separate hatch 36 for the PSU 32 may be replaced with a door similar to the door 24 for the equipment 12. Furthermore, as shown in FIG. 7, the flange 70 may be replaced with a support arm 96 extending over a center of the rack 40. In this case, the axles 72,74 may be located and allow rotation about the center of the rack 40, with the locking mechanism located adjacent either side of the rack 40. These and other minor modifications are within the scope of the present invention.

It can be seen that the BRIEF DESCRIPTION OF THE DRAWINGS section refers to three slightly different embodiments of the present invention. However, each embodiment conforms to the written description and the claims. Thus, slightly different structures may be used without departing from the scope of the present invention.

Moreover, terms such as "first" and "second" are used throughout this document only to differentiate between similar components, and are therefore only important with respect to their relationship to other components. For example, the first side wall 14 may be located on either the cabinet's 10 right or left side. Thus, the door 24 may open toward either the cabinet's 10 right or left side. Additionally, as discussed above, the rack 40 may rotate toward either the cabinet's 10 right or left side. Furthermore, as discussed above, the rack 40 may rotate either toward or away from the door 24.

Having thus described a preferred embodiment of the invention, what is claimed as new and desired to be protected by Letters Patent includes the following:

The invention claimed is:

1. An equipment cabinet that provides full access to equipment mounted therein, the cabinet comprising:
   a housing;
   a rack for supporting the equipment within the housing, the rack including—
      a first vertical member,
      a second vertical member spaced apart from the first vertical member such that the equipment mounts between the vertical members, and
      a top and a bottom crossbar rigidly separating the vertical members; and
   a frame rotatably supporting the rack, the frame including—
      a substantially vertical support adjacent the rack's axis of rotation, and
      a substantially horizontal shelf extending below the rack.

2. The cabinet as set forth in claim 1, wherein the housing includes:
   a first side wall;
   a back wall extending approximately perpendicularly from a rear edge of the first side wall;
   a second side wall extending approximately perpendicularly from the back wall and approximately parallel to the first side wall;
   a top wall connecting top edges of the side walls and the back wall,
   a bottom wall connecting bottom edges of the side walls and the back wall spaced below the top wall; and
   an access door positioned opposite the back wall and having a vertical axis of rotation adjacent the first side wall for selectively protecting the equipment.

3. The cabinet as set forth in claim 2, wherein the rack is rotatably secured to the frame with:
   a vertical axle connecting the rack to the frame adjacent the first vertical member, thereby defining the rack's axis of rotation; and
   a locking mechanism selectively connecting the rack to the frame adjacent the second vertical member, thereby selectively preventing rotation of the rack.

4. The cabinet as set forth in claim 3, wherein the first vertical member is positioned adjacent the first side wall.

5. The cabinet as set forth in claim 3, wherein the first vertical member is positioned adjacent the second side wall.

6. The cabinet as set forth in claim 1, further including a temperature control unit substantially mounted to an exterior of the housing such that the temperature control unit may be substantially fully accessed without substantially exposing the equipment, the temperature control unit being operable to control the equipment's temperature, and a power supply unit mounted to the housing such that the power supply unit may be substantially fully accessed without substantially exposing the equipment, the power supply unit being operable to condition and temporarily provide electrical power to the equipment.

7. An equipment cabinet that provides full access to standard nineteen-inch or twenty-three inch equipment mounted therein, the cabinet comprising:
   a housing including—
      a first side wall,
      a back wall extending approximately perpendicularly from the first side wall,
      a second side wall extending approximately perpendicularly from the back wall and approximately parallel to the first side wall,
      a top wall connecting top edges of the side walls and the back wall,
      a bottom wall connecting bottom edges of the side walls and the back wall and spaced below the top wall, and
      an access door positioned opposite the back wall and having a vertical axis of rotation adjacent the first side wall for selectively protecting the equipment;
   a rack fitting between the top wall and the bottom wall for supporting the equipment within the housing, the rack including—
      a first vertical member adjacent the first side wall,
      a second vertical member spaced apart from the first vertical member and adjacent the second side wall such that the equipment mounts between the vertical members, and
      a top and a bottom crossbar rigidly separating the vertical members;
   a frame rotatably supporting the rack relative to the housing, the frame including—
      a substantially vertical support adjacent the first side wall and presenting a substantially horizontal flange extending toward the second vertical member, and
      a substantially horizontal shelf extending from the vertical support toward the second vertical member below the rack; and
   wherein the rack is rotatably secured to the frame with—
      a top vertical axle connecting the rack to the flange of the vertical support adjacent the first vertical member,
      a bottom vertical axle connecting the rack to the horizontal shelf adjacent the first vertical member, wherein the axles are vertically aligned to allow free rotation of the rack, thereby defining the rack's axis of rotation, and
      a locking mechanism adjacent the second vertical member for selectively preventing rotation of the rack.

8. The cabinet as set forth in claim 7, further including—
   a door sensor operable to monitor the access door;
   a temperature control unit substantially mounted to an exterior of the housing such that the temperature control unit may be substantially fully accessed without substantially exposing the equipment, the temperature control unit being operable to control the equipment's temperature; and
   a power supply unit mounted to the housing such that the power supply unit may be substantially fully accessed without substantially exposing the equipment, the power supply unit being operable to condition and temporarily provide electrical power to the equipment.

9. An equipment cabinet that provides full access to standard nineteen-inch or twenty-three inch equipment mounted therein, the cabinet comprising:
   a housing including—
      a first side wall,
      a back wall extending approximately perpendicularly from the first side wall,
      a second side wall extending approximately perpendicularly from the back wall and approximately parallel to the first side wall,
      a top wall connecting top edges of the side walls and the back wall,
      a bottom wall connecting bottom edges of the side walls and the back wall and spaced below the top wall, and an access door positioned opposite the back wall and having a vertical axis of rotation adjacent the second side wall for selectively protecting the equipment;

a rack fitting between the top wall and the bottom wall for supporting the equipment within the housing, the rack including—
- a first vertical member adjacent the first side wall,
- a second vertical member spaced apart from the first vertical member and adjacent the second side wall such that the equipment mounts between the vertical members, and
- a top and a bottom crossbar rigidly separating the vertical members;

a frame rotatably supporting the rack relative to the housing, the frame including—
- a substantially vertical support adjacent the first side wall and presenting a substantially horizontal flange extending toward the second vertical member, and
- a substantially horizontal shelf extending from the vertical support toward the second vertical member; and wherein the rack is rotatably secured to the frame with—
- a top vertical axle connecting the rack to the flange of the vertical support adjacent the first vertical member,
- a bottom vertical axle connecting the rack to the horizontal shelf adjacent the first vertical member, wherein the axles are vertically aligned to allow free rotation of the rack, thereby defining the rack's axis of rotation, and
- a locking mechanism adjacent the second vertical member for selectively preventing rotation of the rack.

10. The cabinet as set forth in claim 9, further including— a door sensor operable to monitor the access door;

a temperature control unit substantially mounted to an exterior of the housing such that the temperature control unit may be substantially fully accessed without substantially exposing the equipment, the temperature control unit being operable to control the equipment's temperature; and a power supply unit mounted to the housing such that the power supply unit may be substantially fully accessed without substantially exposing the equipment, the power supply unit being operable to condition and temporarily provide electrical power to the equipment.

11. The cabinet as set forth in claim 9, wherein the substantially horizontal shelf of the frame extends from the vertical support toward the second vertical member below the rack.

12. The cabinet as set forth in claim 9, wherein the substantially horizontal shelf of the frame extends from the vertical support toward the second vertical member above the rack.

* * * * *